US009054717B2

(12) United States Patent
Pyeon

(10) Patent No.: US 9,054,717 B2
(45) Date of Patent: Jun. 9, 2015

(54) PLL LOCKING CONTROL IN DAISY CHAINED MEMORY SYSTEM

(71) Applicant: NovaChips Canada Inc., Ottawa (CA)

(72) Inventor: Hong Beom Pyeon, Ottawa (CA)

(73) Assignee: NovaChips Canada Inc., Ottawa, Ontario (CA)

( * ) Notice: Subject to any disclaimer, the term of this patent is extended or adjusted under 35 U.S.C. 154(b) by 0 days.

(21) Appl. No.: 14/066,748

(22) Filed: Oct. 30, 2013

(65) Prior Publication Data

US 2014/0132318 A1 May 15, 2014

Related U.S. Application Data

(60) Provisional application No. 61/724,518, filed on Nov. 9, 2012.

(51) Int. Cl.
| | |
|---|---|
| *H03L 7/06* | (2006.01) |
| *G11C 8/00* | (2006.01) |
| *H03L 7/10* | (2006.01) |
| *H03L 7/22* | (2006.01) |
| *G11C 7/22* | (2006.01) |

(52) U.S. Cl.
CPC .. *H03L 7/10* (2013.01); *H03L 7/22* (2013.01); *G11C 7/222* (2013.01)

(58) Field of Classification Search
USPC ......... 327/156–159, 141, 144–155, 165, 166, 327/261, 291–299, 378, 379, 388, 403, 407, 327/415; 375/354, 373–376; 365/221, 365/189.011, 189.04, 189.14–189.19, 365/233.1, 233.11–233.19, 193; 711/148; 331/1 R, 2

See application file for complete search history.

(56) References Cited

U.S. PATENT DOCUMENTS

| | | | | |
|---|---|---|---|---|
| 8,467,486 | B2 * | 6/2013 | Pyeon | 375/354 |
| 8,781,053 | B2 * | 7/2014 | Pyeon et al. | 375/376 |
| 2003/0231042 | A1 | 12/2003 | Lin et al. | |
| 2007/0076502 | A1 * | 4/2007 | Pyeon et al. | 365/221 |
| 2007/0153576 | A1 | 7/2007 | Oh et al. | |
| 2008/0086590 | A1 * | 4/2008 | Urabe | 711/103 |
| 2009/0154285 | A1 * | 6/2009 | Pyeon | 365/233.1 |
| 2009/0154629 | A1 * | 6/2009 | Pyeon et al. | 375/376 |
| 2013/0243137 | A1 * | 9/2013 | Pyeon | 375/354 |

* cited by examiner

*Primary Examiner* — Lincoln Donovan
*Assistant Examiner* — Thomas Skibinski
(74) *Attorney, Agent, or Firm* — Shin Hung; Borden Ladner Gervais LLP

(57) ABSTRACT

A method, system and apparatus to provide a solution of PLL locking issue in the daisy chained memory system. A first embodiment uses consecutive PLL on based on locking status of backward device on the daisy chained memory system with no requirement of PLL locking status checking pin. A second embodiment uses Flow through PLL control with a locking status pin either using an existing pin or a separated pin. A third embodiment uses a relocking control mechanism to detect PLL relocking from the device. A fourth variation uses flag signal generation to send to the controller.

4 Claims, 16 Drawing Sheets

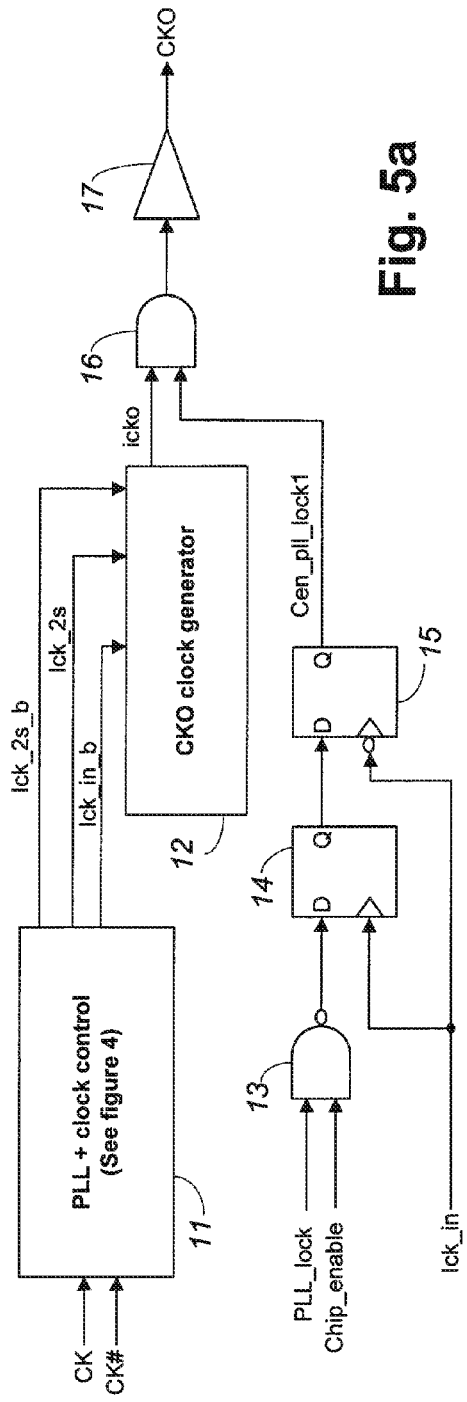
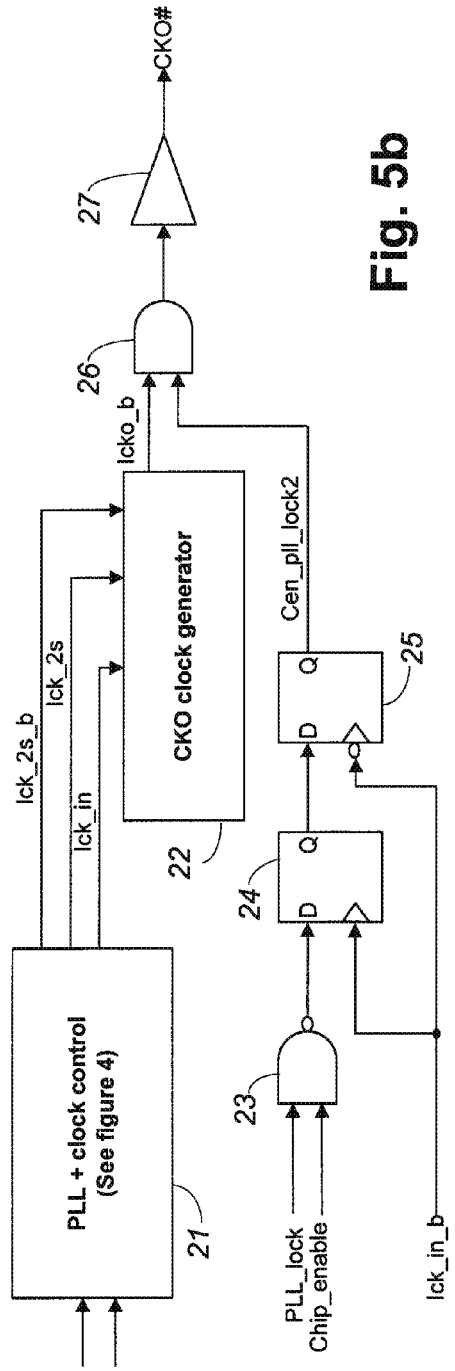
Fig. 5a
Fig. 5b

PLL LOCKING CONTROL IN DAISY CHAINED MEMORY SYSTEM

CROSS REFERENCE TO RELATED APPLICATIONS

This application claims the benefit of U.S. Provisional Patent Application No. 61/724,518, filed on Nov. 9, 2012, which is hereby incorporated by reference.

FIELD OF THE DISCLOSURE

This disclosure relates to memory devices as used in digital electronic devices, and, more particularly, to a memory system having a plurality of memory device dies connected in serial formation usable in daisy chain memory systems.

BACKGROUND OF THE DISCLOSURE

Memory devices are used to store data in digital electronic devices such as computers. The demand for large memory systems with high bandwidth and low power consumption has increased during recent years. Early multi die memory devices in digital electronics included a plurality of dies connected in parallel to a common bus such a system is said to be connected by a multi-drop bus. Multi-drop connection with several memory device dies connected to a common bus in parallel is commonly used for a large memory system.

Flash memory system with daisy chain connection have a serial connected clocking system to mitigate loading effect from the parasitic resistive and capacitive loading of PCB and multi-drop connection inducing heavy input capacitance issues. When clock is bypassed through devices on the series connected ring system, clock's shape is distorted and duty cycle is not kept as original input clock.

FIG. 1 Shows a typical series connected clocking system. Each device obtains a clock signal CK and CK# from the next upstream device except for the first device (0) which obtains the clock signal from an external clock. This system can easily generate distortion which increases for each downstream device.

In order to compensate this distortion of clock shape which is even more important in DDR (Dual Data Rate) devices which operate with a 50:50 duty cycle, a PLL (Phase-Locked-Loop) has to be incorporated into each device. By this PLL, each every device on the series connected device generates duty corrected clock to next device as shown in FIG. 2.

FIG. 3 Shows PLL locking time for each device on the daisy chained memory system and illustrates the problem of consecutive PLL locking control Once PLL is locked, a locking flag signal is generated from the PLL and system can recognize PLL locking status. However, in case of daisy chained memory system, each every device has PLL so PLL locking time could be different among them and system does need to choose which PLL locking information has to be taken from them.

Depending on PLL design type (digital PLL or analog PLL), its locking time is varied along with PVT change at each device. Therefore, the anticipation that the last device on the daisy chained memory system would have longest PLL locking time among them is incorrect.

FIG. 3 illustrates the problem with PLL locking time sequence in a daisy chained memory system. It is apparent that each module has a random lock time. This unexpected sequence of PLL locking time is caused by phase difference from PLL reference clock of each device and source clock from the controller. Only the PLL locking time of the first device on the daisy chained memory system is the fastest among all devices on the same ring, others do not have any determined sequences. Without monitoring PLL locking status of all devices, the controller is unable to transfer any specific command and data securely. The unstable clock threatens malfunction of individual device operations. In addition the timing does not ensure correct phase relationships of block to block into each every device the result could invoke data loss and data contention.

SUMMARY OF THE DISCLOSURE

The disclosure provides a solution of PLL locking issue in the daisy chained memory system A first embodiment uses consecutive PLL on based on locking status of backward device on the daisy chained memory system. This embodiment has no requirement of PLL locking status checking pin.

A second embodiment uses Flow through PLL control with a locking status pin either using an existing pin or a separated pin, A third embodiment uses a relocking control mechanism to detect PLL relocking from the device.

A fourth variation uses flag signal generation to send to the controller.

BRIEF DESCRIPTION OF DRAWINGS

Further features and advantages of the present disclosure will become apparent from the following detailed description, taken in combination with the appended drawings, in which:

FIG. 4b is a timing diagram showing operation of 4a.

FIG. 5a Illustrates the 4a embodiment incorporated into a system of how to control CKO FIG. 5b Illustrates the 4a embodiment incorporated into a system of how to control CKO# without clock distortion;

DESCRIPTION OF EMBODIMENTS

Figure 4A:
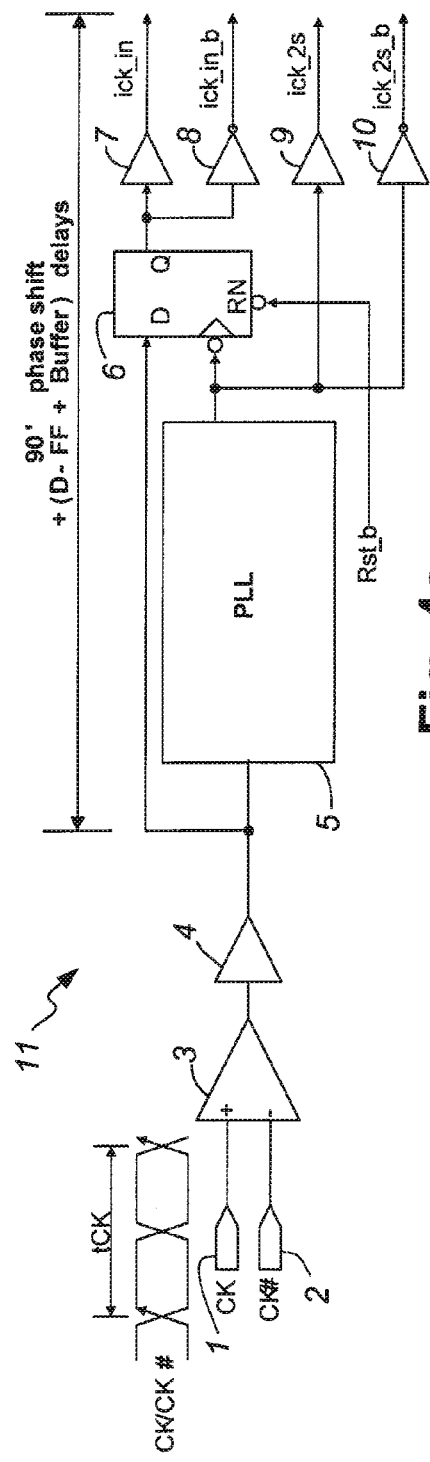
FIG. 4a shows a consecutive clock turn-on method according to an embodiment of this disclosure.
Figure 4B:
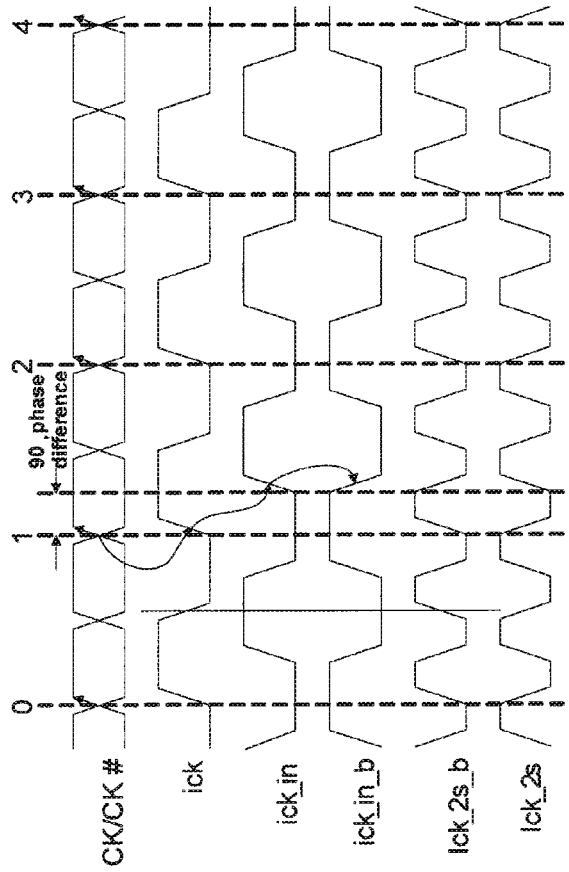

FIG. 4 shows a consecutive clock turn-on apparatus according to an embodiment of this disclosure. This embodiment uses control of clock outputs (CKO and CKO#) with PLL locking signal. Until PLL is locked at each device, CKO and CKO# have flat logic values without any toggling and then CKO and CKO# are generated with locked internal PLL clock.

In FIG. 4a Complementary Clock signals CK and CK# enter Clock Control PLL 11 at inputs 1 and 2 respectively. Inputs 1 and 2 are connected to the inputs of a OP AMP 3. OP AMP 3 detects small differences in phase between CK and CK#. The output of OP AMP 3 is amplified at buffer 4. The output of 4 is connected to the input of Phase Linked Loop 5 and the D input of a latch 6. The output of PLL 5 is connected to the inverted clock input of latch 6 and the inputs of buffer 9 and inverter 10 to produce Ick-2s and Ick-2s-b signals respectively. The Q output of latch 6 is connected to the inputs of buffer 7 and inverter 8 to produce Ick-in and Ick-in-b signals respectively.

Timing diagram 4b illustrates the phase changes of the signal described above as applied to devices 0,1,2,3, and 4 in a daisy chained device of this description.

FIG. 5a illustrates how the FIG. 4a device is incorporated into a memory device 0 to control CKO to the next device 1 without clock distortion. CK and CK# from the external clock enter the device illustrated in FIG. 4a 11 a PLL and clock control. Lck-in-b, Ick-2s, and Ick-2s-b from 11 enter a clock generator CKO 12 which produces a Icko signal which goes to one input of AND gate 16. The PLL-Ick and Chip-enable signals are connected to the inputs of NAND gate 13 the output of which is connected to the D input of latch 14. The Lck-in from 11 is connected to the clock input of 14 and the clock input of an inverting latch 15 the D input of 15 is connected to the Q output of 14. The resulting output Q output of 15 is the Cen-pll-Ick1 signal. The Cen-pll-Ick1 signal is conveyed to the other input of AND gate 16 and amplified by 17 to form the CKO signal for the next memory device in the daisy chain.

FIG. 5b illustrates how the FIG. 4a device is incorporated into a memory device 0 to control CKO# for device 1 without clock distortion. CK and CK# from the external clock enter the device illustrated in FIG. 4a 21 a PLL and clock control. Lck-in, Ick-2s, and Ick-2s-b from 21 enter a clock generator CKO which produces a Icko-b signal which goes to one input of AND gate 26. The PLL-Ick and Chip-enable signals are connected to the inputs of NAND gate 23 the output of which is connected to the D input of latch 24. The Lck-in-b from 11 is connected to the clock input of 24 and the clock input of an inverting latch 25 the D input of 16 is connected to the Q output of 14. The resulting output Q output of 15 is the Cen-pll-Ick2 signal. The Cen-pll-Ick1 signal is conveyed to the other input of AND gate 26 and amplified by 27 to form the CKO# signal for the next memory device 1 in the daisy chain.

Figure 6:
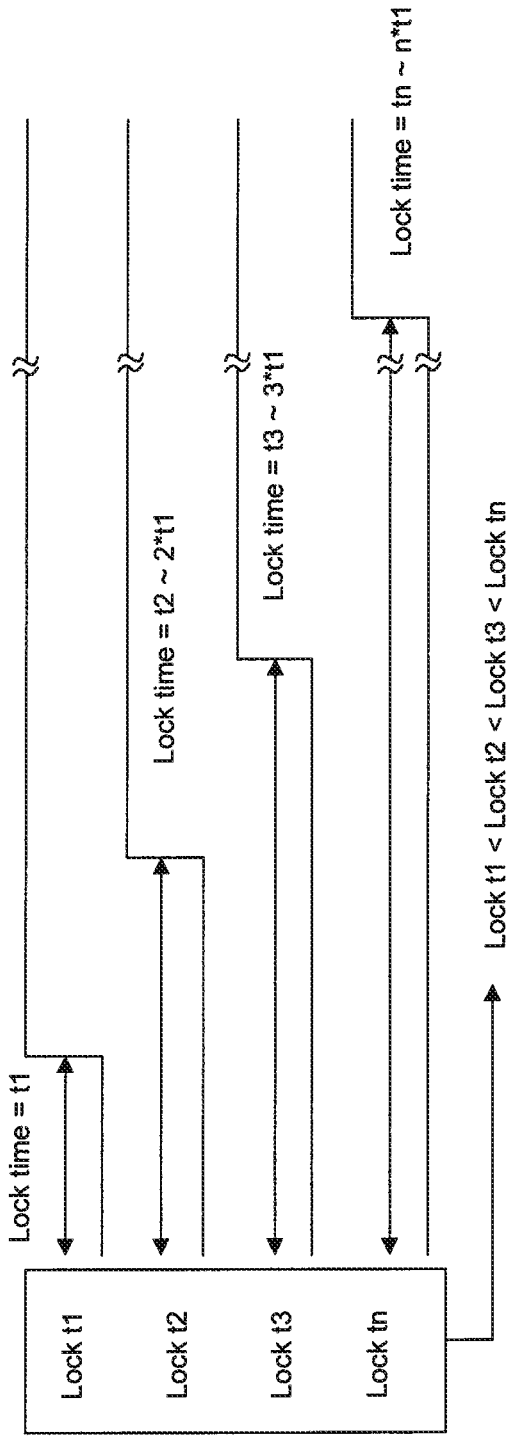
FIG. 6 illustrates the locking time sequence of the FIG. 5ab embodiment.

FIG. 6 illustrates the locking time sequence of the FIG. 5 embodiment; This approach always provides perfect locking situation for all PVT variations and diverse PLL design approaches like semi-analog PLL/analog PLL/Digital PLL/Mixed type PLL. And the CKO/CKO# of the last device on the daisy chained memory system is used to check the locking status. If two clocks are toggled, it means all devices on the daisy chained memory system are now locked for PLL of each every device. So, this approach does not need any additional pin to monitor PLL locking status from the last device or any other points from the devices on the daisy chained memory system.

However, as noticed, the PLL locking time on the daisy chained memory system depends on the number of devices. So, its application is restricted by the number of devices and single PLL locking time of each device.

Case that this approach is used
1. The number of devices on the daisy chained memory system is small
2. PLL locking time of each device is fast (less than 100 clock cycles)

Figure 7:
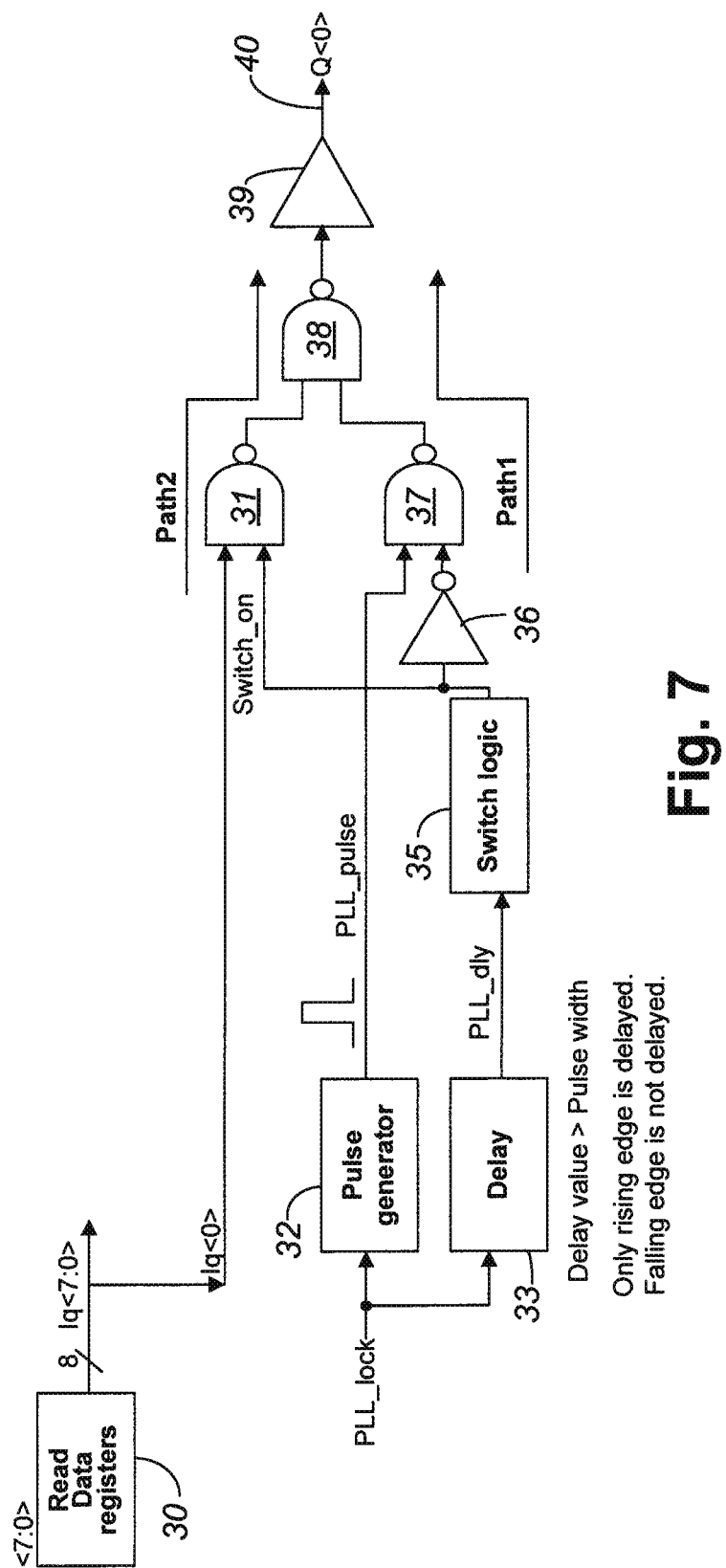
FIG. 7. is a block diagram of a second embodiment.
Figure 8:
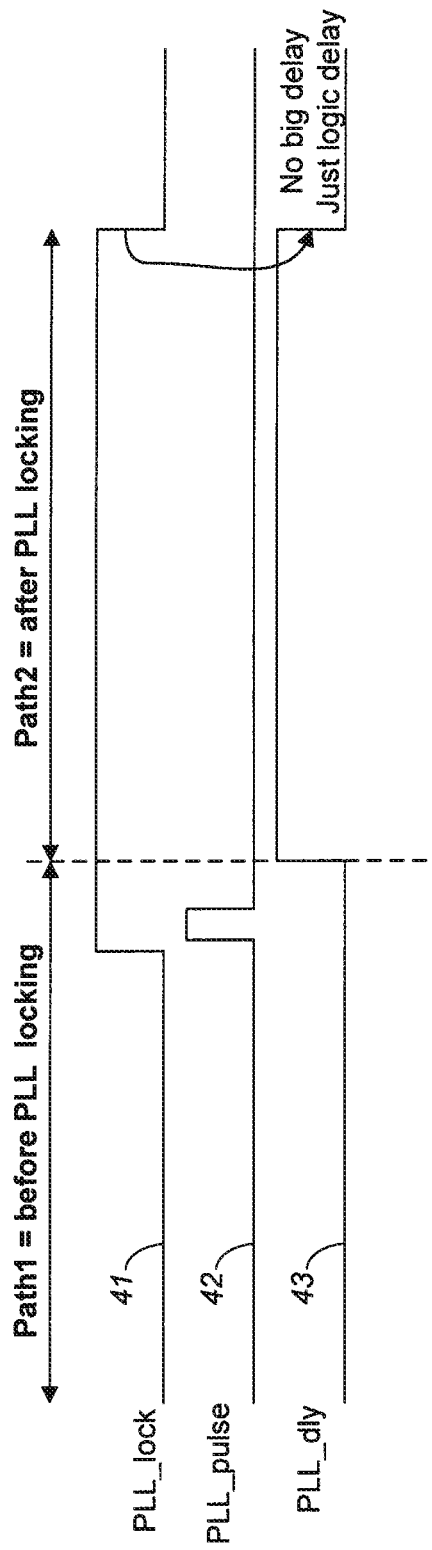
FIG. 8. Is a timing diagram of the FIG. 7 embodiment.
Figure 9:
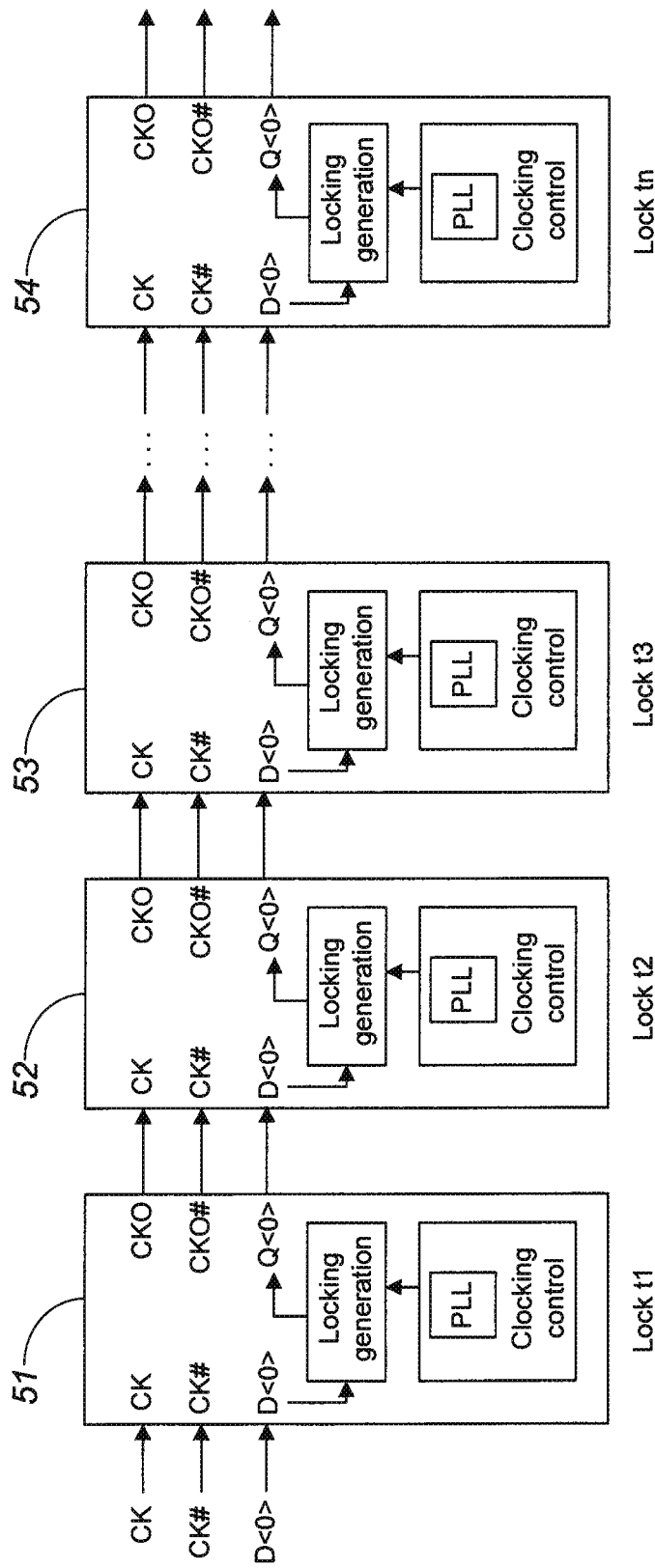
FIG. 9. Is block diagram of a memory device using the FIG. 7 embodiment.

The FIGS. 7, 8, and 9 illustrate a different approach to overcome the linearly increasing PLL locking time of the FIG. 4-6 embodiment. This embodiment is preferable when:
3. PLL locking monitoring—use existing pin
4. All PLL locking status check and choose worst one from a device which has slowest PLL locking status.

FIG. 7. Illustrating the apparatus of a second embodiment of PLL locking monitoring. In this case locking is accomplished with the Q<0> pin. The Q<0> pin, which is one of the common output pins on flash dies, is used to monitor the PLL locking status. Use of the Q<0> pin allows locking without an additional pin this way, one more pin is not required and pin cost can be reduced. The delay element works for only rising edge of PLL_lock. The falling edge has only a very small logic delay.

In the FIG. 7 embodiment there are two data paths. The first path begins when the PLL_Lock from the previous device signal is conveyed to a pulse generator 32 and a delay 33. Pulse generator 32 outputs the PLL_pulse. The delay value of 33 is more than the pulse width and only the rising edge is delayed not the falling edge this produces the PLL_dly signal. The delayed pulse is conveyed to switch logic 35 then to an inverter 36 which inverts the delayed pulse. The inverted delayed pulse and the PLL_pulse are applied to the inputs of a NAND gate 37. Thence to one input of another NAND gate 38. This completes the first data path.

The second data path begins at the Read Data Register 30 which is conveyed to one input of a NAND gate 31. The other input of gate 31 is connected to the output of switch logic 35 and includes the Switch_on signal. The output of gate 31 is connected to the input of gate 38 not connected to gate 37. The output of gate 38 is amplified by buffer 39 and outputted to the Q<0> pin 40.

FIG. 8. Shows basic timing of switching operation before and after PLL locking for Q<0> data path. PLL_lock signal 41 is a regenerated signal along with the backward device PLL locking signal. The PLL_pulse 42 is generated by pulse generator 32 (FIG. 7) in the rise of 41. The PLL_dly signal 43 is the PLL_lock signal delayed by Delay 33. Returning to FIG. 8 it is apparent that path 1 is used before the rise of PLL_dly when locking occurs then path 2 takes over. From the PLL logic, each device receives PLL locking status signal and then after monitoring the status of PLL locking from the backward device. There is no major delay between the falling of 41 and 43 only a minor logic delay.

Figure 1:
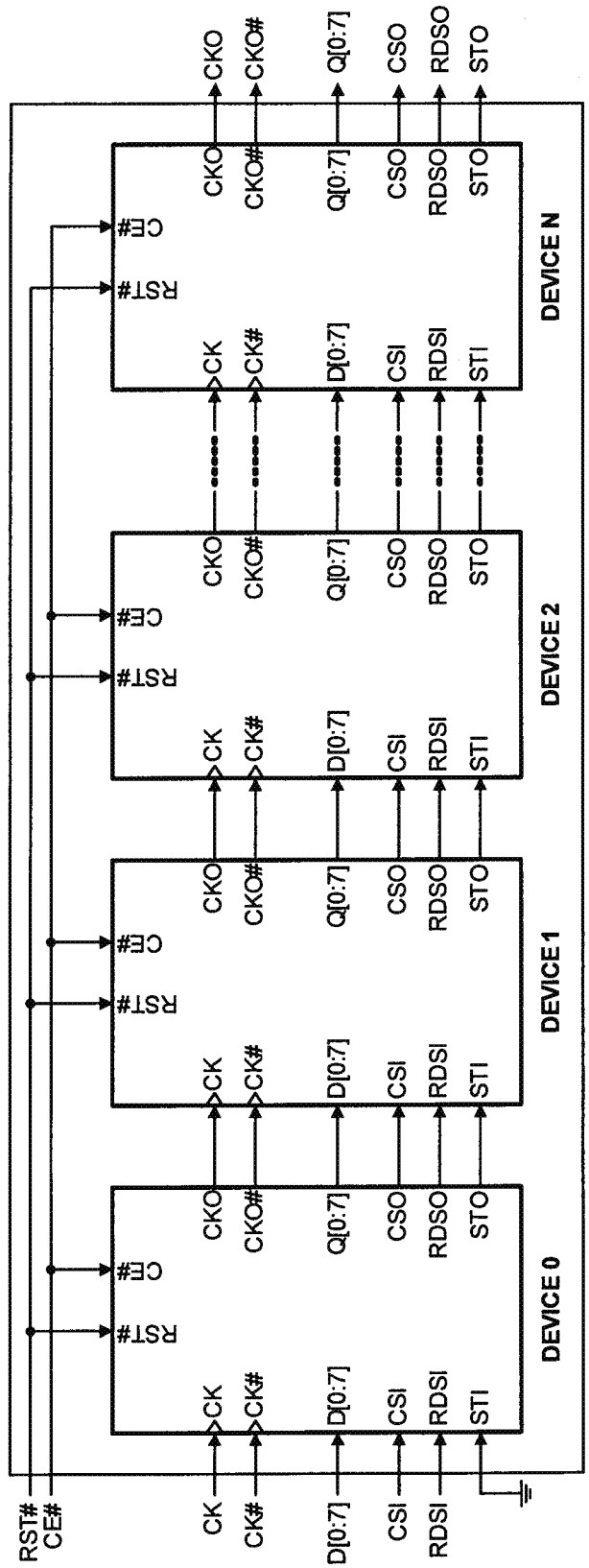
FIG. 1 shows a prior art embodiment shows the general concept of series connected clocking system.
Figure 2:
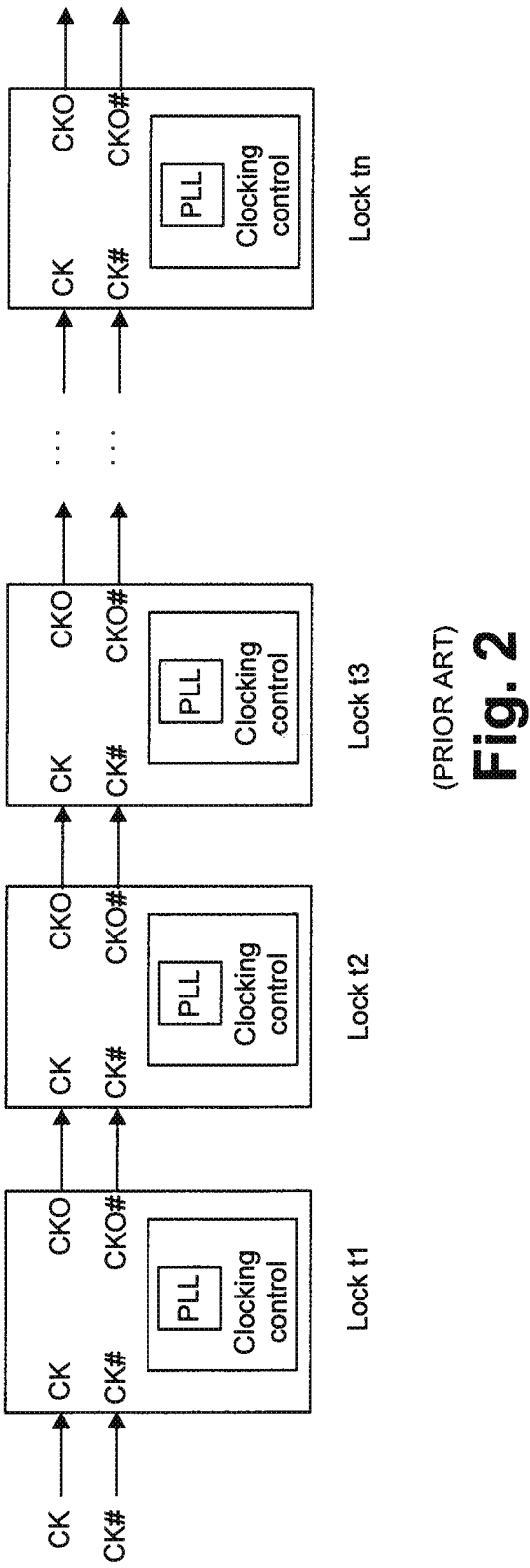
FIG. 2 shows a prior art embodiment of a DDR device.
Figure 3:
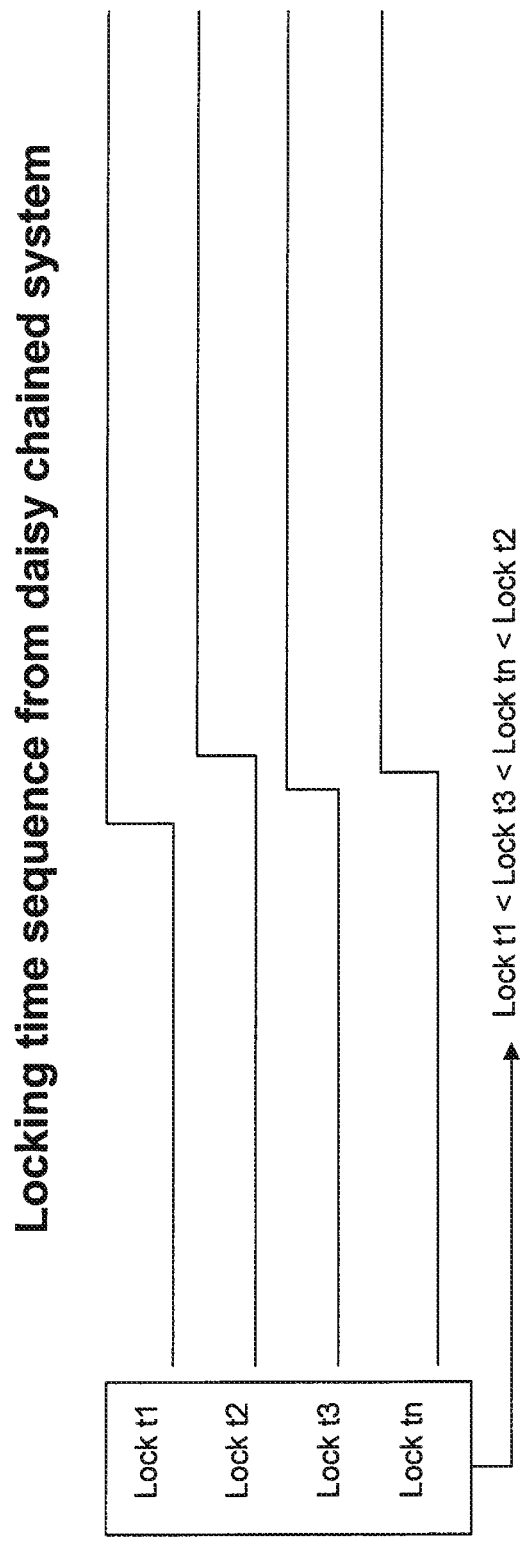
FIG. 3 illustrates an example of PLL locking time sequence in the daisy chained memory system shows PLL locking time for each device on the daisy chained memory system and illustrates the problem of consecutive PLL locking control.

FIG. 9. Is a block diagram of PLL locking signal monitoring and regeneration logic for the FIG. 7 embodiment with multiple daisy chained memory dies t1 51, t2 52, t3 53 and to 54 although four dies are shown any number is possible. The FIG. 9 approach resolves PLL locking time increase from the first approach, somehow. Rather than screening CKO and CKO# from the backward devices as shown in FIG. 3, the forward devices receive clocks and starts PLL operation. So, the case as shown in FIG. 3 happens and no one can know which device would be the last PLL locked device on the daisy chained memory system. Also, this approach requires one pin to monitor PLL locking status. In order to resolve these two issues without adding one more pin, existing pin is used to monitor the PLL locking and new PLL locking signal is issued after considering all PLL locking status.

Figure 10:
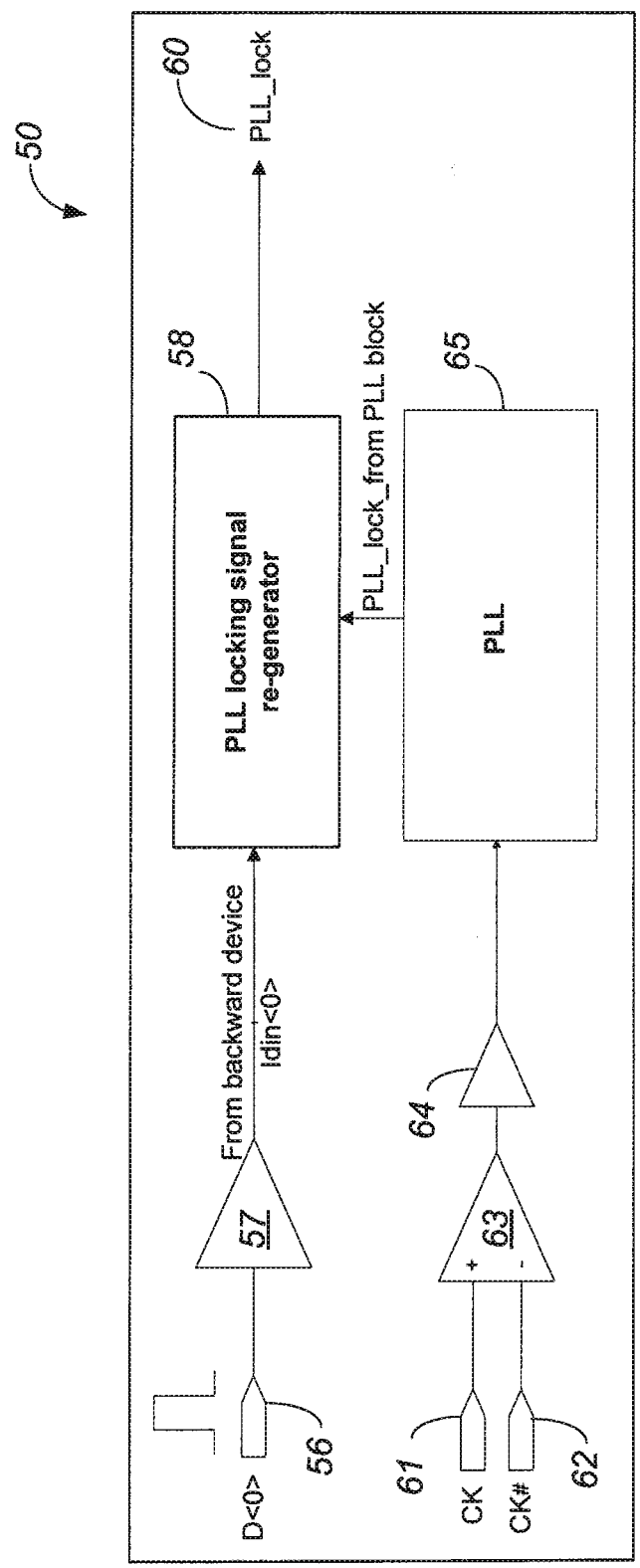
FIG. 10. Is a block diagram of PLL locking signal re-generation logic of the FIG. 7 embodiment.

FIG. 10. Is a block diagram of PLL locking signal re-generation logic 35 of the FIG. 7 embodiment. Before sending the PLL locking information from the PLL block directly to Q<0> pin, PLL locking status from the backward device is monitored via pin D<0> 56 amplified in a buffer. At the same time the CK and CK# signals from pins and respectively are subtracted at and the difference amplified in a buffer and applied to the PLL. Both results are applied to the PLL locking signal re-generator to produce the PLL_lock signal. The resulting signal determines which one is the slower locking signal. After that, the more slower one is sent to Q<0> pin. By this additional logic operation, always, worst PLL locking time is monitored at the last device even though the situation like FIG. 3 happens at real operations.

Figure 11:
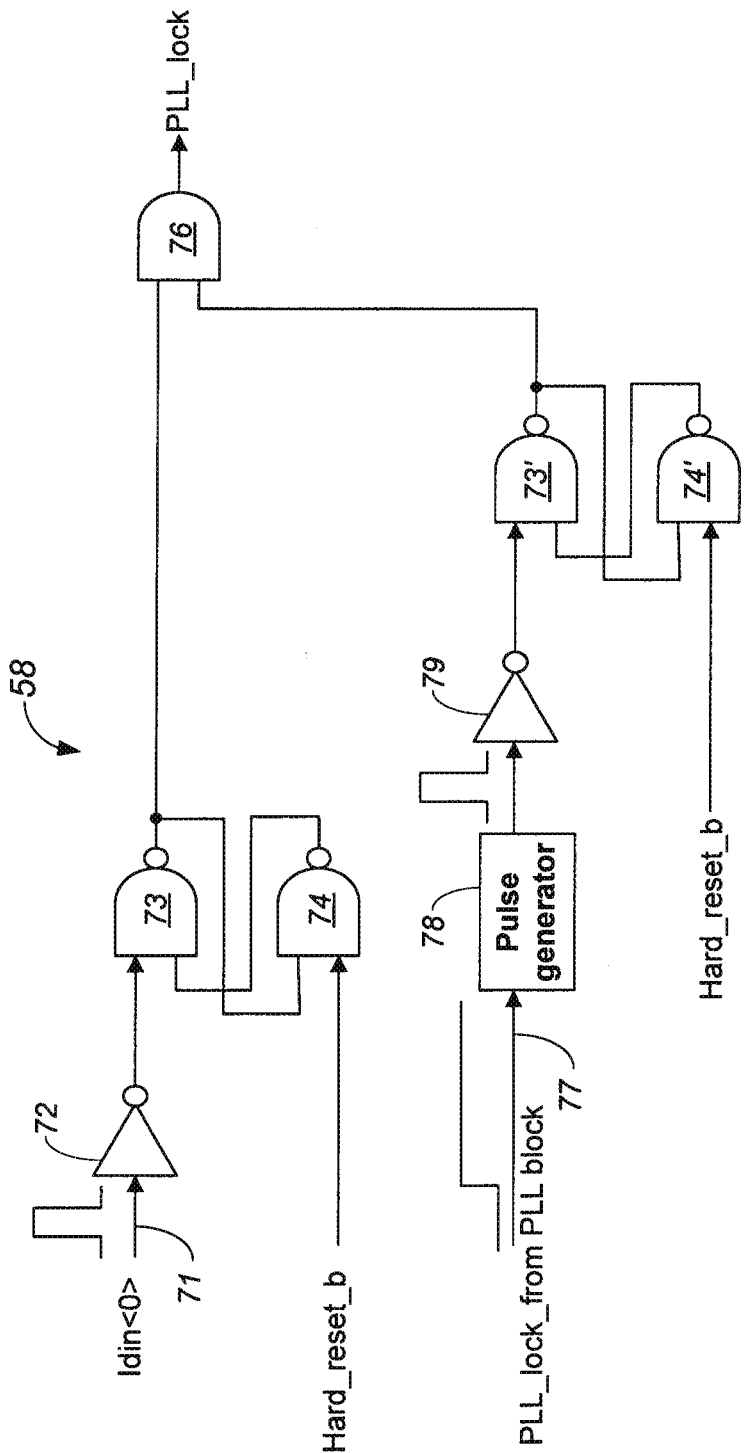
FIG. 11 is a Logic diagram of PLL locking signal re-generator of the FIG. 10 embodiment.

FIG. 11 is a Logic diagram of PLL locking signal re-generator 58 of the FIG. 10 embodiment. In the first device that is connected from a memory controller (not shown), one single pulse 71 has to be issued by the controller to enable one of input signals at the PLL locking signal re-generator. That signal is inverted at 72 then passes two NAND gates 73 and 74 allowing hard reset the signal. The result passes through AND gate 76 to produce the PLL_lock signal for the next device. For the other devices the devices except for the first one, the D<0> input becomes the PLL locking signal from the backward device 77 (See FIG. 9). 77 triggers pulse generator 78 to produce a pulse inverted at 79 which is conveyed to AND gate 76 after passing a hard reset network 73' and 74' to produce the PLL_lock signal for the next stage.

Figure 12:
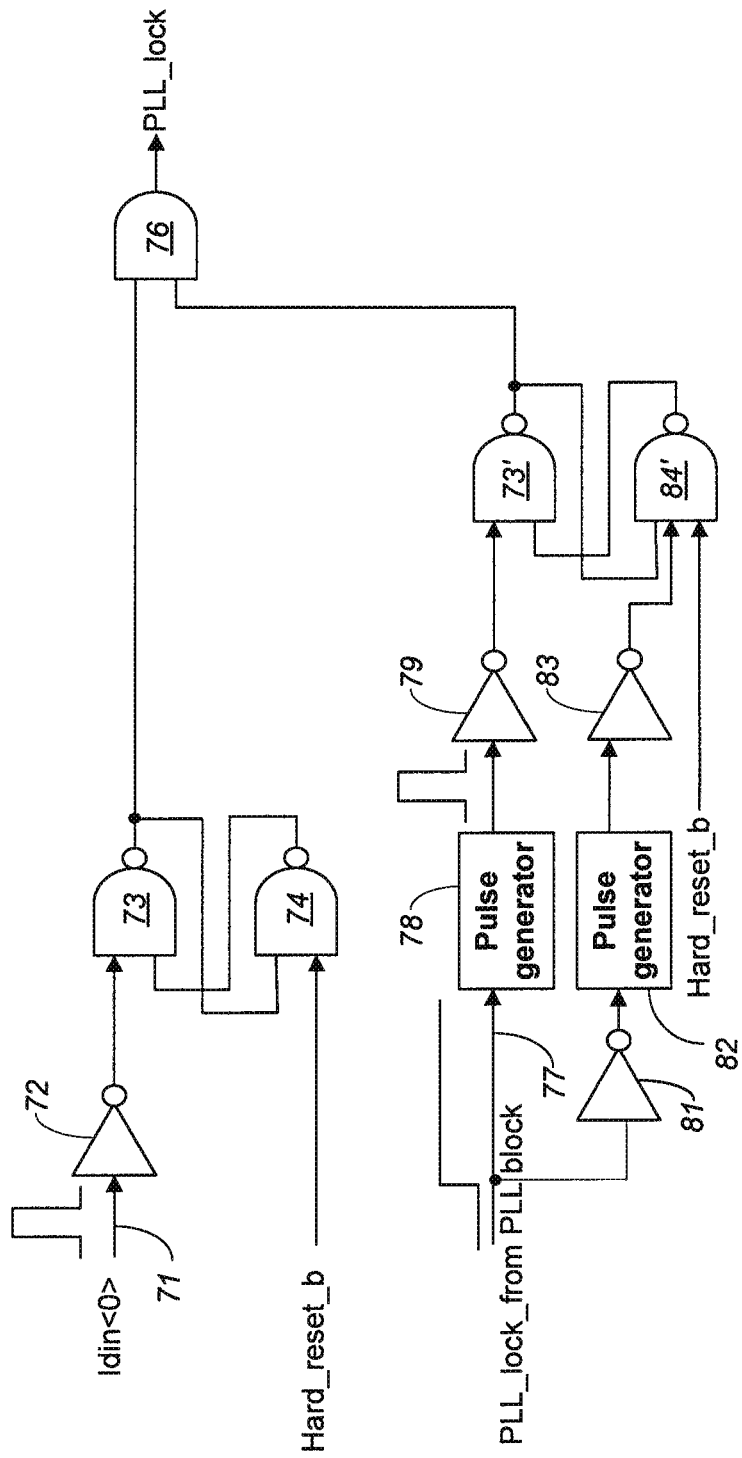
FIG. 12 is a logic diagram of PLL locking signal re-generator of a third embodiment.

FIG. 12 is a logic diagram of PLL locking signal re-generator—of a variation on the FIG. 11 embodiment. Components 71-79 are identical to those in the FIG. 11 embodiment. A second path is provided where the signal from 77 is inverted at 81 to trigger a second pulse generator 82 which is inverted again at 83 and applied to a 3 input NAND gate 84.

The FIG. 12 embodiment provides a disable case of PLL locking after first locking occurs due to drastic Voltage and Temperature changes. Even if the PLL is locked at first time, by sudden change of voltage and temperature, the phase could be unlocked so in that case, FIG. 12 logic disables PLL_lock signal and restarts PLL locking operation at the present device. By PLL_lock signal down, the switch path as shown in FIG. 7 is changed and after re-locking of the present device, path 2 is selected again to send normal data outputs. If this case happens among devices on the daisy chained memory system, the memory controller does not know which device is now being re-locked, so an internal register has to store the PLL unlock status and wait until PLL is re-locked. In order to get which device is now re-locked and cannot be operated according to the controller commands, each device has a function to be able to send the information to the controller.

Figure 13:
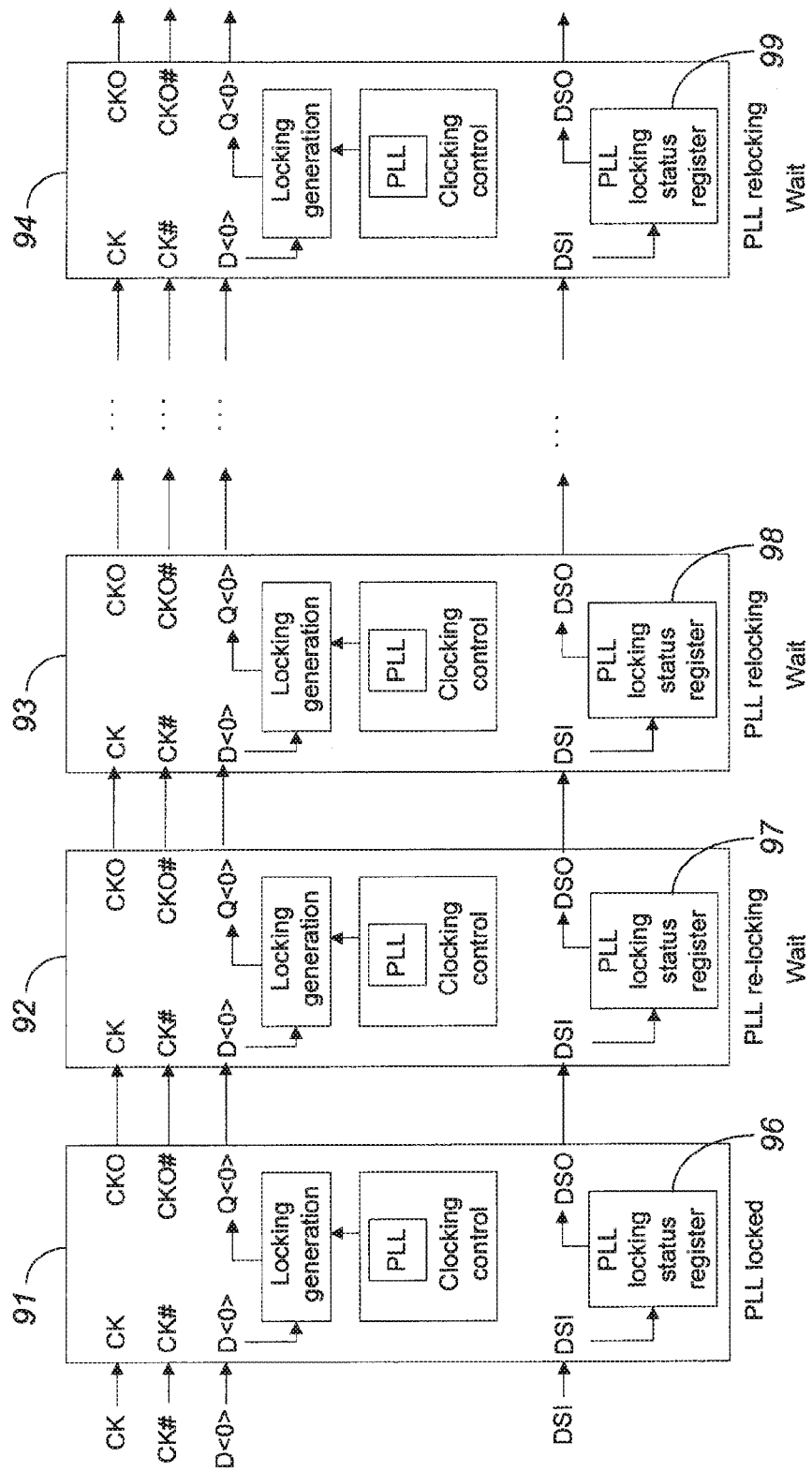
FIG. 13 illustrates PLL re-locking information generation way and path in the FIG. 12 embodiment.

FIG. 13 illustrates PLL re-locking information generation way and path with multiple memory devices PLL0 lkd 91, PLL1 unlkd 92, PLL2 unlkd 92, PLL3 unlkd 93, PLLn unlkd 94 with 4 devices shown using the re-lock as shown in FIG. 12. The locking status registers 96, 97, 98, and 99 are added to devices 91-94 respectively and connected by DSI and DSO pins.

Figure 14:
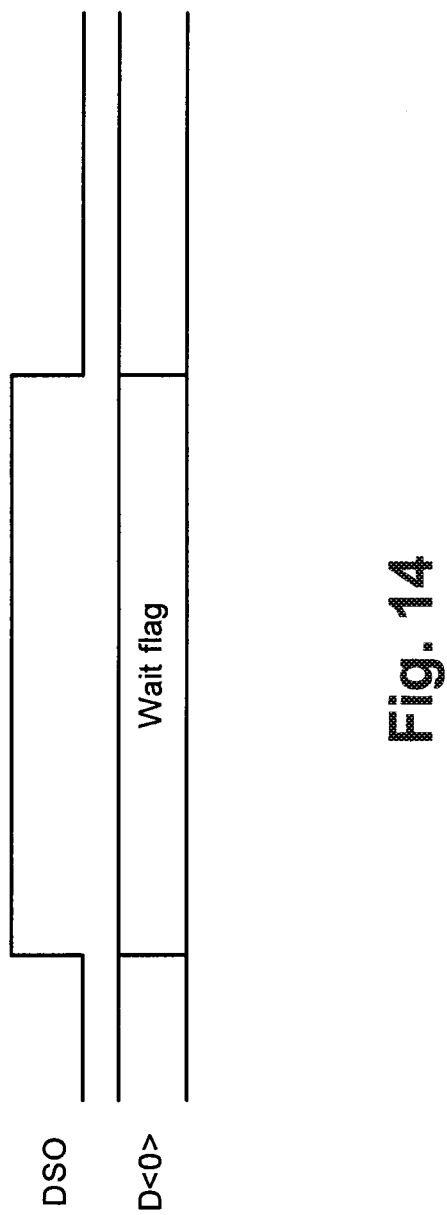
FIG. 14 illustrates asynchronous wait flag sending in a fourth embodiment.

FIG. 14 illustrates another embodiment using an asynchronous wait flag sending with DSO. This wait flag is done asynchronously, that is, without clocking, it is sent to the controller. Because the latency is very short and the clock is not stable yet until PLL is relocked.

Figure 15:
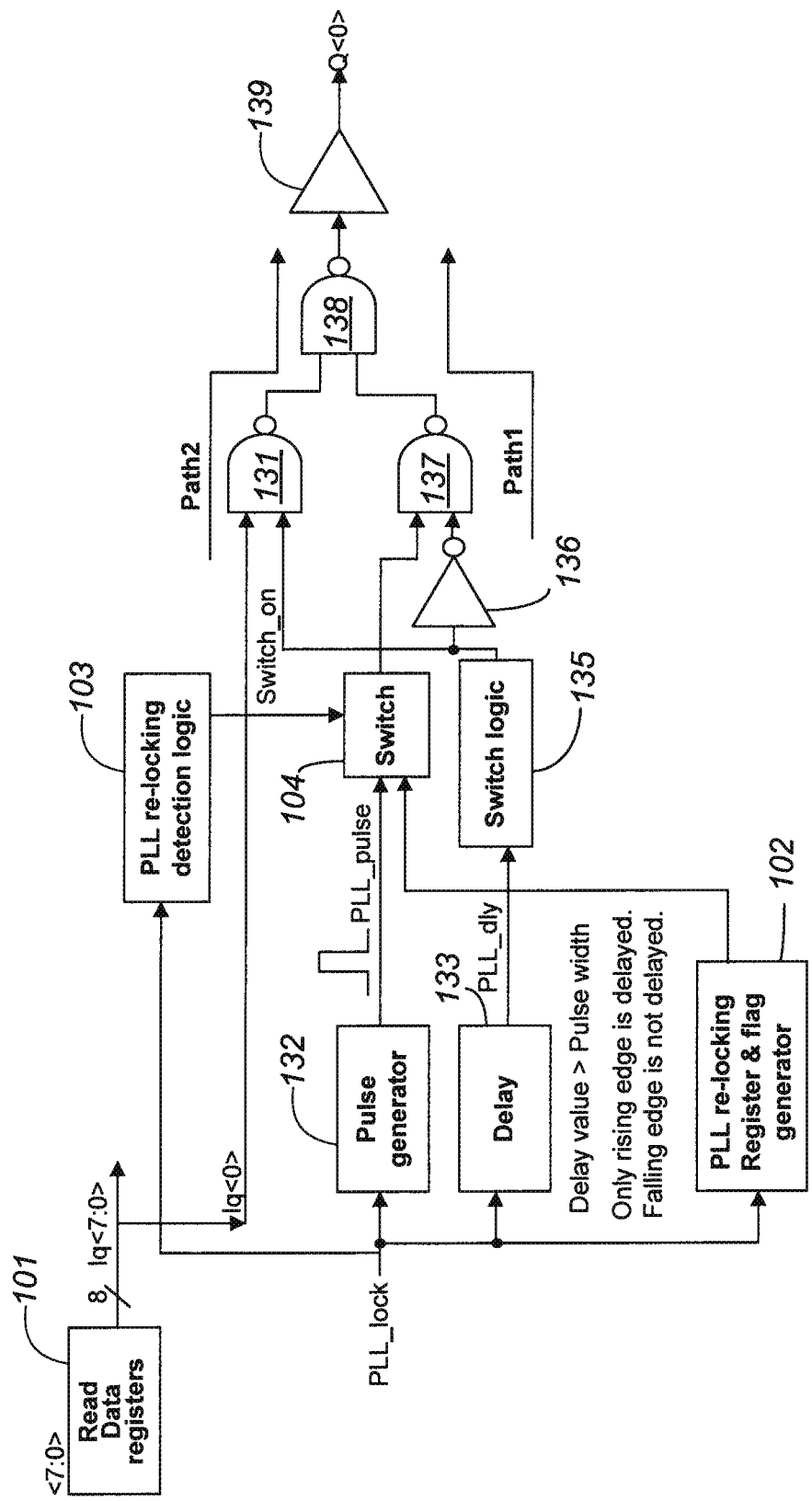
FIG. 15. PLL relocking detection and flag generation block diagram in the FIG. 14 embodiment.

FIG. 15. Is a further embodiment that illustrates PLL relocking detection and flag generation shown in FIG. 14 block diagram in a variation of the FIG. 7 embodiment. FIG. 15 is another version of FIG. 7. In case a tough operating environment FIG. 15 can be implemented.

In the case of the first memory module in the daisy chain, also called path 2, FIG. 15 is identical to FIG. 7. In that case flow through PLL locking control case, the controller has to send one pulse to the first device on the daisy chained memory system through D<0> to initiate the logic of PLL_lock 101 this passes through NAND gates 131 and 138 to buffer 139 to the output on pin Q<0>. This is identical to the passes through NAND gates 31 and 38 to buffer 39 to the output on pin Q<0> in FIG. 7.

Returning to FIG. 15 the path 2 for subsequent devices first path begins when the PLL_Lock from the previous device signal is conveyed to a pulse generator 132 and a delay 133. Pulse generator 132 outputs the PLL_pulse. The delay value of 33 is more than the pulse width and only the rising edge is delayed not the falling edge this produces the PLL_dly signal. The delayed pulse is conveyed to switch logic 135 then to an inverter 136 which inverts the delayed pulse. The inverted delayed pulse and the PLL_pulse are applied to the inputs of a NAND gate 137. Thence to one input of another NAND gate 138. The PLL_Lock also enters a PLL re-locking register and flag generator 102 which generates the flag seen in FIG. 14. At the same time the PLL_Lock signal is conveyed to the PLL relocking detection logic 103. The outputs of PLL re-locking register and flag generator 102 and PLL relocking detection logic 103 activate a switch 104 between pulse generator 104 and NAND gate 137.

Figure 16:
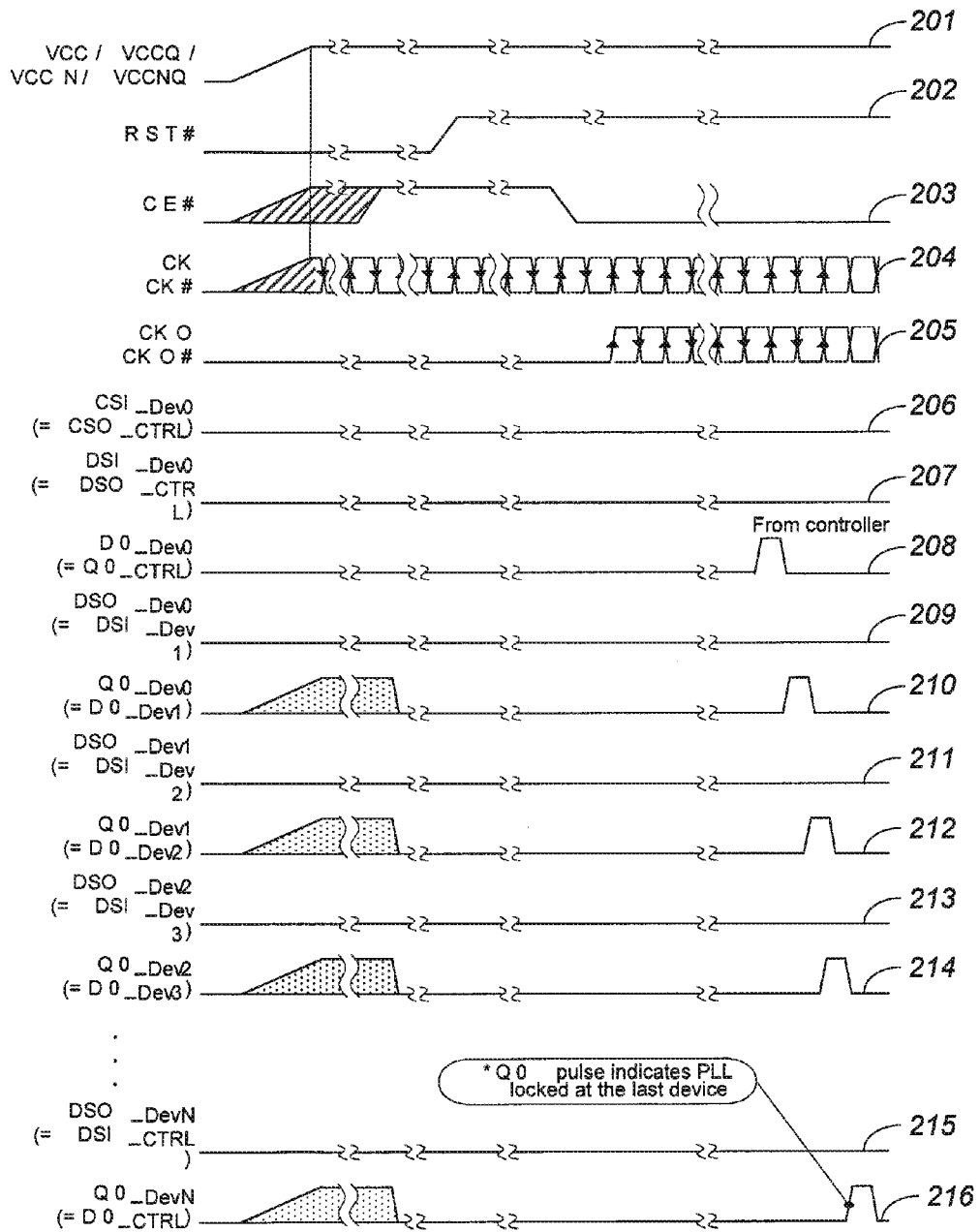
FIG. 16. Illustrates PLL locking timing at power up in the FIG. 15 embodiment.

FIG. 16. Is a timing diagram of the FIG. 15 embodiment Illustrating PLL locking timing from power up. It is best understood in viewing FIG. 13. The power up begins with VCC/VCCQ' and VCCN/VCCNQ' applied to all devices 201. After a delay RST# is applied 202. CE#203 and CK/CK#204 ramp up immediately but CKO/CKO#205 is delayed until 203 goes down. CSI at device 1 from controller CSQ 206 is flat on this graph as is DSI at device 1 from controller DSQ 207 is flat as are the DSO outputs for all subsequent devices 209, 211, 213, and 215. The device 0 output on Q 210 is a pulse delayed from 208 and an initial ramp up ignored by the system. The device 1 output on Q 212 is a pulse delayed from 210 and an initial ramp up ignored by the system. The device 2 output on Q 214 is a pulse delayed from 212 and an initial ramp up ignored by the system. from the controller DQ is a delayed pulse 208. The device n output on Q 216 is a pulse delayed from 214 and an initial ramp up ignored by the system. The Q0_devN signal 216 indicates that the PLL is locked on the last device in the system.

The invention is defined solely by the attached claims.

The invention claimed is:

1. A memory module for use in a daisy chained memory system having multiple memory modules each module including a Phase Locked Loop (PLL) comprising:
    circuitry configured to monitor the status of the PLL of a backward device in a daisy chain;
    further circuitry configured to delay locking of said PLL until locking has occurred in the backward device;
    locking circuitry configured to lock the PLL upon notification from said further circuitry; and
    a locking status pin, the locking status pin being a Q<0> pin.

2. A memory system comprising:
    a plurality of memory modules connected in series each memory module including a Phase Locked Loop;

a memory controller connected to the first and last memory module;

circuitry in each memory module configured to monitor the status of the PLL of an adjacent backward device in the daisy chain;

further in each memory module, circuitry configured to delay locking of said PLL until locking has occurred in the adjacent backward device;

locking circuitry in each memory module configured to lock the PLL upon notification from said further circuitry;

a locking status pin on each memory module, the locking status pin being a Q<0> pin.

3. A memory system comprising:

a plurality of memory modules connected in series each memory module including a Phase Locked Loop;

a memory controller connected to the first and last memory module;

circuitry in each memory module configured to monitor the status of the PLL of an adjacent backward device in the daisy chain;

further in each memory module, circuitry configured to delay locking of said PLL until locking has occurred in the adjacent backward device;

locking circuitry in each memory module configured to lock the PLL upon notification from said further circuitry;

a locking status pin on each memory module, the locking status pin being an added dedicated pin.

4. A memory system comprising:

a plurality of memory modules connected in series each memory module including a Phase Locked Loop;

a memory controller connected to the first and last memory module;

circuitry in each memory module configured to monitor the status of the PLL of an adjacent backward device in the daisy chain;

further in each memory module, circuitry configured to delay locking of said PLL until locking has occurred in the adjacent backward device;

locking circuitry in each memory module configured to lock the PLL upon notification from said further circuitry;

a locking status pin on each memory module;

a PLL re-locking register configured to store PLL information of the state of the PLL locking state; and, a flag generator configured to generate an asynchronous wait flag.

\* \* \* \* \*